United States Patent

Redwantz

[15] 3,662,230

[45] May 9, 1972

[54] A SEMICONDUCTOR INTERCONNECTING SYSTEM USING CONDUCTIVE PATTERNS BONDED TO THIN FLEXIBLE INSULATING FILMS

[72] Inventor: James O. Redwantz, Dallas, Tex.

[73] Assignee: Texas Instruments Incorporated, Dallas, Tex.

[22] Filed: Nov. 30, 1970

[21] Appl. No.: 93,912

Related U.S. Application Data

[63] Continuation of Ser. No. 739,855, June 25, 1968, abandoned.

[52] U.S. Cl. ....................317/234 R, 317/234 E, 317/234 F, 317/234 G, 317/234 H, 317/101 A, 29/589

[51] Int. Cl. ..........................................H01l 3/00, H01l 5/00

[58] Field of Search ............317/234 A, 234 E, 234 F, 234 G, 317/234 H, 234 J, 234 N, 101, 101 A; 29/587, 588, 589, 590

[56] References Cited

UNITED STATES PATENTS

| | | | |
|---|---|---|---|
| 3,256,465 | 6/1966 | Weissenstern et al. | 317/101 |
| 3,262,023 | 7/1966 | Boyle | 317/234 G |
| 3,311,798 | 3/1967 | Gray | 317/234 |
| 3,363,146 | 1/1968 | Dijkmeijer et al. | 317/101 |
| 3,387,365 | 6/1968 | Stelmak | 317/234 G |
| 3,388,301 | 6/1968 | James | 317/234 |

OTHER PUBLICATIONS

IBM Technical Disclosure Bulletin; By Heitzman Vol. 8, No. 2, July 1965 pp. 333– 334.

IBM Technical Disclosure Bulletin; By Totta, Vol. 9 No. 11, April 1967 pp. 1654– 1655.

IBM Technical Bulletin; By Nestark et al., Vol. 9 No. 11 April 1967 pp. 1518– 1519.

IBM Technical Bulletin; By Miller et al., Vol. 10 No. 12 May 1968 pp. 1977– 1978.

*Primary Examiner*—John W. Huckert
*Assistant Examiner*—Andrew J. James
*Attorney*—Samuel M. Mims, Jr., James O. Dixon, Andrew M. Hassell, Harold Levine, Melvin Sharp, Gerald B. Epstein and John E. Vandigriff

[57] ABSTRACT

A highly reliable, low cost packaging system for one or more semiconductor chips each having metal contact pads on at least one face. A rigid support is provided for the semiconductor chip and also the large leads which are used to connect the packaged device in an external circuit. A set of thin metallic film strips are bonded to a thin flexible dielectric sheet for support. The set of metal strips interconnects the contact pads on the semiconductor chips and selected leads to electrically interconnect the semiconductor device and the leads. Where a plurality of semiconductor devices are used, a plurality of dielectric sheets can be stacked and electrical connections made between the different layers of metal film strips through openings in the dielectric sheets. Several processes for assembling the packages are also described.

4 Claims, 6 Drawing Figures

INVENTOR:

JAMES O. REDWANZ

E. Mickey Hubbard

ATTORNEY

INVENTOR:

JAMES O. REDWANZ

E. Mickey Hubbard

ATTORNEY

A SEMICONDUCTOR INTERCONNECTING SYSTEM USING CONDUCTIVE PATTERNS BONDED TO THIN FLEXIBLE INSULATING FILMS

This application is a continuation of application Ser. No. 739,855 filed June 25, 1968 and now abandoned.

This invention relates generally to semiconductor devices, and more particularly relates to a system for packaging one or more semiconductor devices so that they can be conveniently connected into an electrical system.

It is common practice in the semiconductor industry to package one or more semiconductor chips in a hermetically sealed package comprised of a header and a can. The header typically has two or more metal leads which extend through a ceramic or other insulating seal and terminate at a point within the package. Each semiconductor chip may include a single semiconductor device, or a number of discrete semiconductor devices integrated into a common functional circuit by means of interconnecting metal film leads. In either case, metal contacts are formed on the surface of the semiconductor chip and these are connected to the respective leads extending through the header by very fine jumper wires.

The jumper wires may be bonded to the metal pads and to the ends of the header lead wires by various methods such as thermo-compression ball bonding, ultrasonic bonding, soldering, or electric gap welding. While these procedures are highly developed in the art, they are nevertheless expensive because each device must be individually fabricated by hand. This is particularly true when packaging integrated circuits because a large number of leads are involved, and the problems are amplified when more than one integrated circuit chip is included in the same package. Further, the jumper wires are very fragile and cannot be insulated without significant additional processing steps and expenses. As a result, the wires often break or come in shorting contact with some other part of the semiconductor device or package, thus reducing yield and increasing cost, and reducing reliability in use.

This invention is concerned with an improved system for interconnecting the semiconductor chips and the larger package leads which are used to connect the device into an external circuit.

In accordance with this invention, one or more sets of thin conductive film strips supported by a thin, flexible sheet of insulating material are used to interconnect the contact pads on one or more semiconductor devices and the larger leads. The fabrication processes of this invention may be more easily and fully automated and devices therefore produced more economically. In addition, the devices are more reliable in operation.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
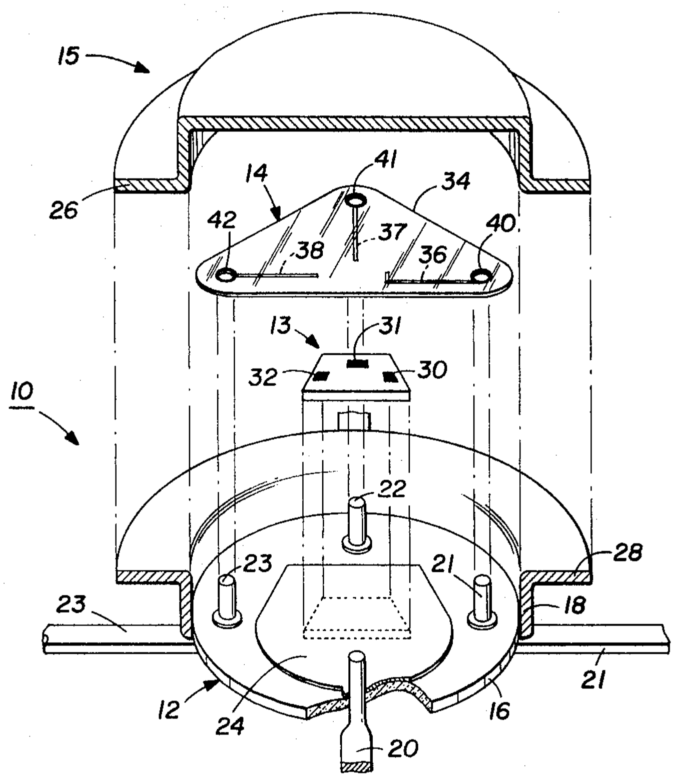
FIG. 1 is an exploded perspective view of a device in accordance with the present invention, partially broken away to reveal details of construction.
Figure 2:
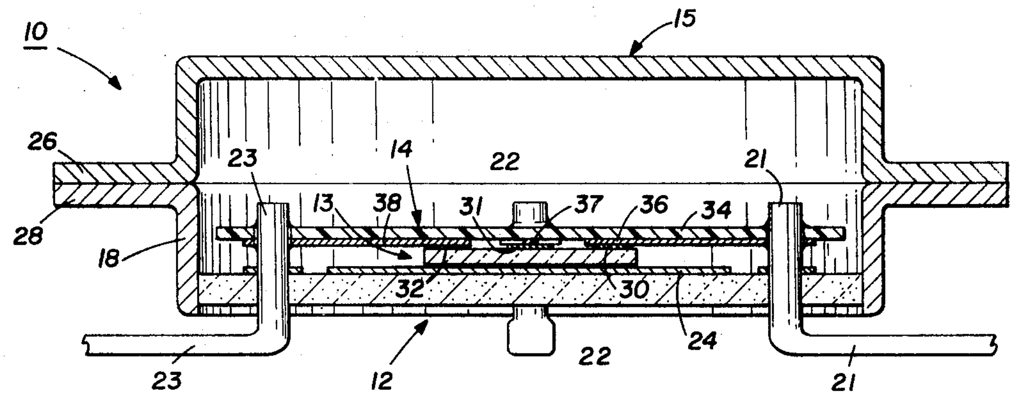
FIG. 2 is a sectional view of the device of FIG. 1.

Referring now to the drawings, and in particular to FIGS. 1 and 2, a device constructed in accordance with the present invention is indicated generally by the reference numeral 10. The device 10 includes a conventional semiconductor device 13 and interconnection means 14 hermetically sealed in a package comprised of a header assembly 12 and a can 15.

The header assembly 12 includes a ceramic disk 16 which is hermetically sealed within a metal ring 18. Four pin leads 20–23 extend through the ceramic disk 16 and are hermetically sealed in the disk. The ends of the leads 20–23 extend at right angles from the ceramic disk 16 beyond the interior face of the disk 16 by a substantial distance for purposes which will presently be described. The external ends of the leads are flattened and bent outwardly at 90° to facilitate connecting the device into a printed circuit board without extending the leads through apertures in the board in the conventional manner. A metal film 24 is deposited on the interior face of the ceramic disk 16 and is in electrical contact with only lead 20. The can 15 is merely a metal cap having a peripheral flange 26 which is welded to a mating flange 28 on the header to provide a hermetic seal after the semiconductor device 13 and interconnection means 14 have been fixed in place as will presently be described.

The semiconductor device 13 may be any conventional type, and may include either a discrete component, a plurality of discrete components, or an integrated circuit formed by interconnecting a plurality of discrete components with a metallized film patterned to form interconnecting leads in the conventional manner. In any event, however, the semiconductor device 13 is provided with a plurality of metallized bonding pads 30–32 on one face. For some applications, metal extensions (not illustrated) which project outwardly from the semiconductor device may be formed on the bonding pads 30, for purposes which will hereafter be more evident. The semiconductor device 13 is alloyed, soldered or otherwise bonded to the metallized layer 24 to make electrical contact between lead 20 and the bottom surface of the semiconductor device, provide mechanical support for the device, and promote heat dissipation from the device.

The interconnection means 14 is comprised of a thin sheet of insulating material 34 which supports a plurality of thin metallic film strips 36–38. The metal film strips 36–38 are formed on the face of the sheet 34 that is adjacent the semiconductor device 13. The ends of the metal strips 36–38 terminate in a pattern which registers with the contact pads 30–32, respectively, on the top face of the semiconductor device 13. The other ends of the strips 36–38 extend to apertures 40–42 in the sheet 34 which are sized and positioned to receive the pin leads 21–23, respectively. A metallized ring is formed around each of the apertures 40–42 which are in electric contact with the leads 36–38, respectively. When assembled as illustrated in FIG. 2, the inner ends of the leads 36–38 are bonded to the contact pads 30–32 and the metallized rings around the apertures 40–42 are bonded to the pins 21–23, respectively. The insulating sheet may be any suitable material which can be subjected to a sufficiently high temperature to effect a bond between the strip conductors and the contact pads and pin leads, such as, for example, Mylar, nylon, or H-film. The metal conductive strips may be any suitable metal, such as copper, gold, aluminum or gold plated copper, the latter being particularly useful for thermo-compression bonding when used with H-film.

In accordance with one process of this invention, the header assembly 12, semiconductor device 13 and interconnection means 14 are assembled in one operation. The semiconductor device 13 is oriented in the proper position on the header assembly 12 with a suitable relatively low melting point, conductive bonding material, such as solder, disposed between the semiconductor device and the metallic pad 24. The interconnection means 14 is positioned on the semiconductor device 13 with the ends of the metal film strips 36–38 oriented over the bonding pads 30–32. A suitable relatively low melting point bonding material, such as solder, is disposed at the apertures 40–42 adjacent the junction between the pins 21–23 and the respective strip conductors 36–38 and also between the strip conductors 36–38 and contact pads 30–32. The bonding material may be precoated on one or more of the parts, or may be a separate member, such as a small ring. The stack is then placed in an oven and heated to a temperature sufficient to melt the bonding material being used, then cooled so that the semiconductor device 13 is bonded to the metallic pad 24 on the header assembly, the metal film strips 36–38 are bonded to the contact pads 30–32 on the semiconductor device 13, and the metallized rings around the apertures 40–42 are bonded to the pins 21–23. The can 15 may then be welded in place in the conventional manner to complete the hermetically sealed package.

In accordance with another aspect of the process of this invention, the semiconductor device 13 is first aligned with the interconnection means 14 so that the ends of the strip conductors 36–38 register with the contact pads 30–32. The pads 30–32 and strips 36–38 are then bonded by conventional thermo-compression techniques. This procedure is facilitated if the insulating sheet is H-film, the strip conductors are gold plated copper at the point of the bond, and the contact pads are gold. Alignment is facilitated by reason of the fact that the insulating sheet 34 is sufficiently transparent to see the contact pads through the sheet. Next, the assembly of the semiconductor device 13 and interconnection means 14 is placed on the header with suitable bonding means, such as solder, between the semiconductor device and the plate 24 and with the apertures 40–42 over the ends of the pins 21–23. The portion of the strip conductors around apertures 40–42 may be precoated with the bonding material, or the bonding material may be a ring placed around each of the pins. When the device is heated to a temperature sufficient to melt the bonding material, then cooled, the semiconductor device 13 will be secured in place and electrically connected to the lead pins. A can 15 may then be welded in place to complete the hermetically sealed package.

Alternatively, either or both ends of the conductor strips may be precoated with solder or other low melting point metal, and soldered to the contact pads by heat and pressure. The assembly of the semiconductor device and the interconnection means may then be used for any number of applications, particularly if the strip conductors are precoated with solder.

Figure 3:
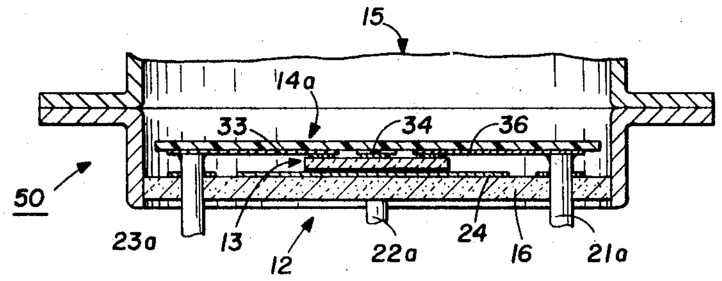
FIG. 3 is a sectional view of another device in accordance with the present invention.

FIG. 3 is a sectional view very similar to FIG. 2 which illustrates another embodiment of the invention. In FIG. 3 corresponding components are designated by the same reference numerals used in connection with FIGS. 1 and 2. Thus, a header assembly 12 includes the identical ceramic disk 16, semiconductor device 13, and can 15. However, the four lead pins (only **21*a*, 22*a* and 23*a* being illustrated) and the interconnection means 14*a* are slightly modified. The pins 21–23 are shortened so as to extend approximately to the same height as, or only slightly higher than, the thickness dimension of the semiconductor device 13 above the disk 16. The interconnection means 14*a* is identical to the interconnection means 14 except that the sheet 34 and the strip conductors 36–38 are continuous in the areas of the apertures 40–42**.

The device 50 may be fabricated in accordance with the first process described for fabricating the device 10. The absence of the apertures, however, requires only that the semiconductor device 13 be generally positioned on the header 12 within the tolerances required to position the ends of the strip conductors 36–38 over the ends of the pin leads 21–23. Then the interconnection means **14*a* can be more precisely aligned so that when the strip conductors 36–38 register with contact pads 30–32, the conductors will also automatically be aligned with the pin leads. Thus, the alignment requirements for the chip 13 are relaxed for the device 50 when compared with the alignment requirements for the chip 13 in device 10. The device 50 can also be fabricated using the second method described for fabricating device 10 wherein the chip 13 is first mated with the interconnection means 14*a*, and then the two assembled components mated with the header assembly. This procedure is particularly advantageous when the strip conductors are precoated with solder. The latter step only requires that the strip conductors be sufficiently aligned with the lead pins to make contact. The device 50** also more readily permits the use of other bonding techniques such as thermo-compression bonding, particularly when H-film or other high temperature material is used for the insulating sheet, gap welding, ultrasonic, and the like.

Figure 4:
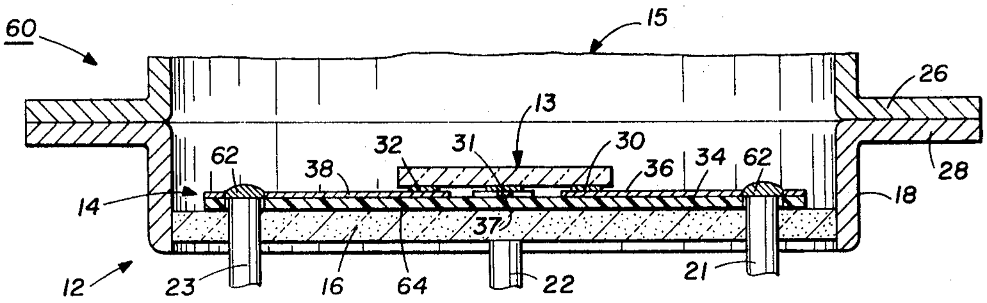
FIG. 4 is a sectional view of still another device in accordance with the present invention.

Another embodiment of the device is indicated generally by the reference numeral 60 in FIG. 4. Those parts of the device 60 may be identical to the corresponding parts of the device 10 and are indicated by the same reference numerals, except that the metal pad 24 serves no useful purpose and may be eliminated if desired. However, the semiconductor device 13 and the interconnection means 14 are each inverted and are stacked in inverse order.

Thus, the device 60 is comprised of the header assembly 12 having a ceramic disk 16 and pins 21–23. The header 12 need not have a metallized plate 24, which, of course, means that if an electrical connection is to be made to the substrate of the device 13, it must be made from the same face as contact pads 30–32.

The interconnection means 14 is disposed with the insulating sheet 34 directly on the ceramic disk 16, which permits the use of a header having a metal carcass. The metal film strips 36–38 are disposed on top of the insulating sheet 34 and the semiconductor device 13 is inverted so that the contact pads 30–32 are on the lower face adjacent to the upwardly facing strip leads 36–38. The interconnection means 14 is preferably provided with the apertures 40–42, and the ends of the lead pins 21–23 may extend to a height approximately equal to the thickness of the insulating sheet 34, as shown, or may extend substantially higher. The pins 21–23 and strip leads 36–38 may then be mechanically and electrically interconnected by a body of solder or other bonding material 62.

The apparatus 60 may be fabricated in accordance with another process of the invention by first aligning and bonding the ends of the strip leads 36–38 to the contacts 30–32, as previously described. The interconnection means 14 is then merely placed on the header 12 with the apertures 40–42 over the pins 21–23. Small disks 62 of relatively low melting point bonding material may be placed on top of the lead pins 21–23, within the apertures in the contact strips, or a donut of the bonding material placed around the lead pins if the pins extend above the contact strips. If desired, a suitable bonding agent can also be used to secure the insulating sheet 34 to the ceramic disk 16 as represented at 64. The assembly may then be heated to a temperature sufficient to melt the bonding material, then cooled to form the bonds 62. The can 15 may then be secured in place to complete the hermetically sealed package.

Figure 5:
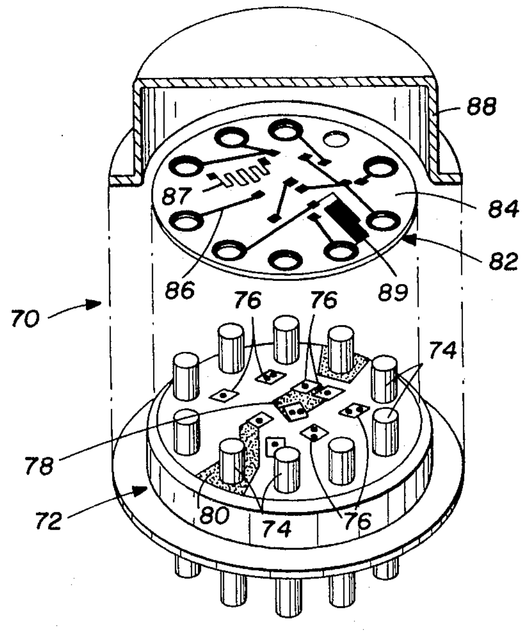
FIG. 5 is an exploded, simplified perspective view illustrating still another embodiment of the present invention.

Referring now to FIG. 5, another device constructed in accordance with the present invention is indicated generally by the reference numeral 70 in the exploded isometric view of FIG. 5. The device 70 is comprised of a conventional ceramic header 72 having a large number of pins 74. A plurality of individual semiconductor devices 76, any one or more of which may be one or more devices, are bonded at various positions on the header 72. The substrates of some of the semiconductor devices 76 may be electrically interconnected by a metal film 78 deposited on the surface of the ceramic header 72. Similarly, the substrates of other semiconductor devices may be electrically connected to one or more of the pins 74 by a metal film, such as represented at 80. Each of the semiconductor devices 76 has metal contact pads formed on one face as previously described in connection with the semiconductor device 13.

An interconnection means, indicated generally by the reference numeral 82, has an insulating sheet 84 which supports a plurality of metallized strip conductors 86. The interconnection means 82 may be fabricated of the same materials previously described in connection with the interconnection means 14. The metallized strip conductors 86 are used to interconnect metallized contact pads on selected semiconductor devices 76 with the contact pads of other semiconductor devices 76, and to interconnect other of the contact pads on the semiconductor devices with selected pins. Thus, the strip conductors 86 are used to connect the semiconductor devices 76 into a functional circuit, for example, and to connect the functional circuit to the pins 74, which are used to connect the functional circuit into a system external to the package. The functional circuit may include a meandering line resistor 87, a thin film capacitor 89, or any other suitable passive elements which may be bonded to the insulating sheet 84 for support. Finally, a can 88 is connected to the header 72 to complete the hermetically sealed package.

As illustrated, the device 70 takes the general form of the device 10, and accordingly can be fabricated by either of the methods described in connection with the fabrication of the device 10. However, the device 70 can also incorporate the same modifications as devices 50 or 60, and can then be manufactured by the processes described for fabricating those devices.

Figure 6:
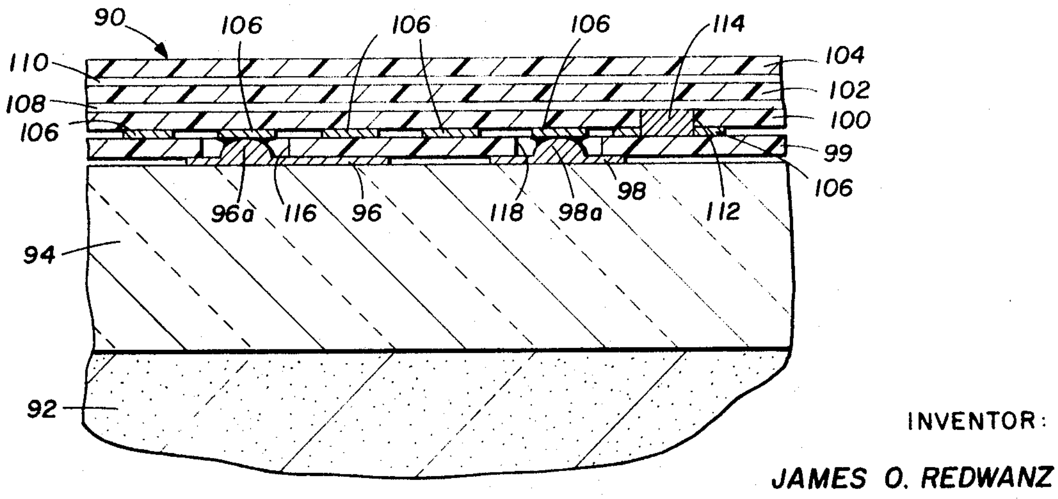
FIG. 6 is a greatly enlarged, partial sectional view of still another device constructed in accordance with the present invention.

An alternative embodiment of the interconnection means for any of the devices heretofore described, but which is particularly useful in a device embodying a large number of separate semiconductor devices, is indicated generally by the reference numeral 90 in FIG. 6. In FIG. 6, the ceramic disk of a header is indicated generally by the reference numeral 92, and a semiconductor device is indicated by the reference numeral 94. The semiconductor device 94 will typically be an integrated circuit and only a portion of the device is shown in FIG. 6 for convenience of illustration. Expanded contact pads 96 and 98 are provided on the surface of the semiconductor device 94 in the conventional manner. However, metallic pedestals or raised portions 96*a* and 98*a* are provided on the expanded contact pads 96. The raised portions 96*a* and 98*a* preferably have a height at least as great as the thickness of an insulating sheet of the interconnection means 90 which will now be described.

The interconnection means 90 is comprised of a sandwich of insulating sheets 99, 100, 102 and 104. Insulating sheets 100, 102 and 104 support metallized strip conductors 106, 108 and 110. As illustrated, the strip conductors 106 extend at right angles to the plane of the drawing, while conductors 108 (only one of which is illustrated) extend parallel to the plane of the drawings and thus cross over the conductors 106. Of course, the conductors 106 and 108 need not be disposed at right angles, but can be disposed as required. The strip conductors 110 may extend in any desired direction, or may be a continuous sheet to provide an RF shield, commonly referred to as a grounded plane, as required. Interconnections may be made between the different levels of conductors, for example conductors 106 and 108, by punching a hole 112 through the insulating sheet 100 and through an expanded portion of a conductor 106. A body of metal 114, such as solder, may then be used to interconnect the conductor 106 and the conductor 108 through the aperture 112. Or, the two levels of interconnections can be bonded directly by depressing one conductor through a larger aperture in the insulating sheet and performing a thermo-compression or other conventional bond. The lowermost insulating sheet 99 is provided with apertures 116 and 118 which receive the projections 96*a* and 98*a* from contacts 96 and 98, respectively. The projections 96*a* and 98*a* preferably have a height greater than the thickness of the insulating sheet 99 so that they will come in contact with, and can be bonded to, the strip conductors 106 carried between insulating sheets 99 and 100.

In accordance with another aspect of the method of the present invention, the interconnection means 90 may be fabricated by positioning insulating sheet 102 with the conductor strips 108 face up. The insulating sheet 100 is then disposed over the insulating sheet 102 and the aperture 112 aligned with the appropriate conductor 108. The conductor 106 on the sheet 100 may then be bonded to the conductor 108. This procedure may be repeated as required to make other connections, or all such connections can be made simultaneously by placing a disk of solder in each of the apertures 112 and heating the sandwich to a temperature sufficient to melt the solder. Of course, if more than two layers of interconnecting conductor strips are to be used, the same procedure can be used between the adjacent layers of strip conductors as required.

Assuming that the conductive sheet 110 is an RF ground plane, the insulating sheet 104 and metal sheet 110 can then be merely bonded to the insulating sheet 102 by a suitable agent. Similarly, the apertured insulating sheet 99 can be bonded over the strip conductors 106.

The raised portions 96*a* and 98*a* can be formed by an electrodeposition, or ball bonding technique, to form a spherical projection of metal having a temperature higher than the temperature of the metal used for bonding. Then either the projections 96*a* and 98*a*, or the mating portion of the conductors 106 may be coated with the bonding metal, such as solder, two parts placed in contact, heated to a temperature sufficient to melt the solder, then cooled to effect a bond. The raised portions 96*a* and 98*a* can also be connected to the overlying strip conductors by thermocompression bonding, ultrasonic bonding, or other suitable means.

The semiconductor devices 94 may be first mated with interconnection means 90, and this assembly then mated with a header, or the semiconductor devices 94 may be first mated with the header, then the interconnection means 90 mated with the semiconductor devices and header, or the bonding may be simultaneous.

The apertured insulating sheet 99 may also be used to advantage when only a single layer of strip conductors is required, such as in the devices 10, 50 and 60. In such a case, the contact pads on the semiconductor device can be built up as illustrated in FIG. 6, or the aperture in the insulating sheet can be made sufficiently large that the strip conductor can be deformed through the aperture against the contact pad. It should also be appreciated that the projections 96*a*, 98*a*, for example, can be made sufficiently high to extend through a plurality of levels of insulating sheets and strip conductors and be directly bonded to a strip conductor.

It will also be appreciated that the assembly of a semiconductor device and the interconnection means is a commercial device which can readily be pretested by a customer, then packaged in substantially any hermetically sealed package, or into a hybrid circuit, which may then be hermetically sealed.

The strip conductors on the interconnection means may also be meandering lines to form resistors. Such a device is particularly useful in multiple emitter power transistors where a resistor is connected in each emitter circuit to prevent thermal runaway. Other passive elements such as capacitors can also be supported on the insulating sheet of the interconnection means.

It is to be understood that the semiconductor devices 13, 76 and 94 may contain either one single discrete semiconductor element or may contain an integrated circuit suitable for performing an electronic function. Or the devices may be a semiconductor chip having a plurality of individual integrated circuits each adapted to perform an electronic function, with these circuits interconnected into a system or array by one or more levels of leads. Such devices are sometimes referred to as medium scale integrated circuits or large scale integrated circuits, depending upon the number of circuits in the array. The interconnection means 90 is particularly suited for interconnecting a number of individual integrated circuits or integrated circuit arrays mounted on a common rigid substrate or heat sink. In the latter case, the leads extending from the common header or other support 92 may be in the form of pins or leads as illustrated in connection with devices 10, 50, 60 and 70, or may be in the nature of printed circuits on the support 92. It should also be understood that the header which forms the rigid support may be of any desired form, including, but not limited to, flat packs for integrated circuit chips, stud type packages wherein the leads extend upwardly from the surface on which the semiconductor is mounted to the lid or can, which provides the electrically insulated feedthrough for the individual leads.

Although several embodiments of the invention have been described in detail, it is to be understood that various changes, substitutions and alterations can be made in the parts of the devices and in the steps of the processes without departing from the spirit and scope of the invention as defined by the appended claims.

What is claimed is:

1. A hermetically sealed semiconductor package for an electrical system, comprising in combination:

a. a rigid insulating support having major surfaces and edges;

b. a plurality of spaced conductor pins transversely extending through and secured to said rigid insulating support;

c. a plurality of semiconductor components secured to one major surface of said rigid insulating support in a preselected spaced relationship;

d. a relatively thin, flexible insulating support being relatively thin with respect to said rigid insulating support and having 1. planar surface;

2. a plurality of selectively spaced bonding pads formed on said one planar surface;

3. a plurality of selectively spaced passive elements formed on said one planar surface; and 4. a plurality of selectively spaced openings formed in said flexible insulating support in respective co-axial relationship with said conductor pins, with said other planar surface abuting said one major surface of said rigid insulating support;

e. a semiconductor device having selectively spaced contact pads formed thereon, said contact pads being selectively secured to said bonding pads on said flexible insulating support; and f. housing means secured to said rigid insulating support and overlying said one major surface thereof for hermetically sealing said package; wherein g. said conductor pins, semiconductor components, passive elements and semiconductor device are selectively interconnected by said conductive pattern to form said electrical system.

2. The semiconductor device is in accordance with claim 1 further including at least two electrically conductive regions disposed on opposite sides of the said flexible insulating support, said regions having substantial overlap, with electrical interconnections between said electrically conductive regions and said semiconductor device, whereby said two electrically conductive regions form a capacitor.

3. The hermetically sealed semiconductor package of claim 1 and further including:

a. a plurality of said flexible insulating supports, each of which has its opening in respective coaxial relationship with said conductor pins; wherein b. said conductor pins, semiconductor components, passive elements, and semiconductor device of said rigid insulating support and said flexible insulating supports are selectively interconnected to form said electrical system.

4. A semiconductor package in accordance with claim 3,wherein at least one of said flexible insulating supports is substantially covered with a layer of electrically conductive material, said electrically conductive material serving as a ground plane.

* * * * *

UNITED STATES PATENT OFFICE
CERTIFICATE OF CORRECTION

Patent No. 3,662,230 Dated May 9, 1972

Inventor(s) James O. Redwanz

It is certified that error appears in the above-identified patent and that said Letters Patent are hereby corrected as shown below:

On the cover sheet, [72], the inventor's name should read -- James O. Redwanz --.

Signed and sealed this 31st day of October 1972.

(SEAL)
Attest:

EDWARD M.FLETCHER,JR.
Attesting Officer

ROBERT GOTTSCHALK
Commissioner of Patents